United States Patent
Clara et al.

(10) Patent No.: US 7,898,329 B1
(45) Date of Patent: Mar. 1, 2011

(54) COMMON-MODE ROBUST HIGH-LINEARITY ANALOG SWITCH

(75) Inventors: Martin Clara, Villach (AT); Daniel Gruber, St. Andrä (AT); Christian Fleischhacker, Pischeldorf (AT)

(73) Assignee: Lantiq Deutschland GmbH, Neubiberg (DE)

( * ) Notice: Subject to any disclaimer, the term of this patent is extended or adjusted under 35 U.S.C. 154(b) by 0 days.

(21) Appl. No.: 12/582,470

(22) Filed: Oct. 20, 2009

(51) Int. Cl.
*H03F 3/45* (2006.01)

(52) U.S. Cl. .......................... 330/254; 330/9
(58) Field of Classification Search ................. 330/254, 330/258, 9; 327/124, 307
See application file for complete search history.

(56) References Cited

U.S. PATENT DOCUMENTS

| | | | |
|---|---|---|---|
| 6,674,679 B1 * | 1/2004 | Perner et al. | 365/209 |
| 7,368,968 B1 * | 5/2008 | Lai et al. | 327/307 |
| 7,391,201 B2 * | 6/2008 | Ji | 323/368 |
| 2009/0195305 A1 | 8/2009 | Ballarin et al. | |

FOREIGN PATENT DOCUMENTS

DE 10246776 A1 5/2004

* cited by examiner

*Primary Examiner*—Henry K Choe
(74) *Attorney, Agent, or Firm*—Coats & Bennett, P.L.L.C.

(57) ABSTRACT

A differential gain stage includes a plurality of programmable passive circuit component arrays operable to set a gain of the gain stage. The gain stage also includes an active switch gate control circuit and a passive switch gate control circuit. The active switch gate control circuit controls a gate voltage applied to transistor switch components of each programmable passive circuit component array as a function of the level of common mode disturbance input to the differential gain stage for common mode frequencies below a particular frequency threshold. The passive switch gate control circuit controls the gate voltage applied to the transistor switch components as a function of the level of common mode disturbance for common mode frequencies above the frequency threshold. The differential gain stage can for part of a receiver such as an xDSL receiver.

25 Claims, 7 Drawing Sheets

COMMON-MODE ROBUST HIGH-LINEARITY ANALOG SWITCH

BACKGROUND

The input stage of a digital transceiver typically includes a fully differential programmable gain stage which operates as a low-noise amplifier. The differential programmable gain stage scales a small differential signal present at its input to a full-scale value for analog-to-digital conversion or other processing. The gain (G) of a differential programmable amplification stage is given by:

$$G = R_2/R_1 \quad (1)$$

where R1 is the resistance between the signal input and the input of the differential amplifier and R2 is the resistance between the input of the differential amplifier and the output. R1 and R2 are often implemented as programmable resistor arrays so that the gain of the amplifier can be adjusted by controlling the number of resistors switched into or out of the input and output resistance networks. For MOS (Metal Oxide Semiconductor) based technologies, R1 and R2 can be made programmable by connecting resistors in series with MOS transistor switches. The MOS transistor switches are in turn connected to the virtual ground nodes of the differential amplifier, i.e., the input nodes of the differential amplifier located between R1 and R2. R1 and R2 can be adjusted by activating or deactivating different ones of the transistor switches.

For many systems, the receiver input is AC-coupled. The common-mode control of the differential amplifier stage senses the average of the single-ended output voltages and forces them to the applied common-mode voltage (VCM). The input nodes of the amplifier are kept at the same potential via R2. However, common-mode sensitivity with respect to linearity is problematic for conventional differential amplifiers. For example, the inputs to the differential amplifier may not only carry the wanted (small) differential receive signal, but also a common-mode signal may appear, e.g., when the external signal ground differs from the on-chip ground, or the receive signal has picked up a common-mode disturbance along the line. Common mode disturbance is present in many types of communication technologies such as power line communication and xDSL, where x is a placeholder for different DSL (Digital Subscriber Loop) technologies.

The differential voltage at the virtual ground nodes of the amplifier stage is very small due to the large differential gain of the amplifier. The situation is different for a common-mode input signal. For operational amplifiers, the common-mode is sensed and controlled at the outputs of the amplifier. As such, the virtual ground nodes can experience a relatively large common-mode excursion, especially at high gain-settings. Assuming an ideal common-mode control at the output of the amplifier, the common mode voltage at the virtual ground nodes of the amplifier is given by:

$$V_{VGND,CM} = V_{IN,CM} \frac{R2}{R1+R2} = V_{IN,CM} \frac{G}{1+G} \quad (2)$$

where $v_{IN,CM}$ is the common mode disturbance at the receiver input. For sufficiently large differential gain G, the common-mode signal at the receiver input is directly transferred to the amplifier inputs. Even at low gain settings, the common-mode signal appearing at the virtual ground nodes of the operational amplifier can be considerably large, e.g., for G=1 (0 dB) a common-mode attenuation of 6 dB results from equation (2).

In a standard implementation, the gates of the MOS transistor switches included in the programmable resistor arrays (R1 and R2) are connected to a positive supply voltage when switched on. Under these conditions, the common-mode voltage present at the source and drain of each activated transistor switch modulates the channel resistance (RON) of the transistor by changing the gate overdrive voltage. For applications requiring high linearity, the linearity of RON is a critical parameter that limits receiver performance. A mixing of the differential input voltage with the common-mode signal occurs at the amplifier inputs when RON is modulated by common mode disturbance, causing reduced receiver dynamic range. The modulation of RON occurs because of signal-dependent fluctuations in the gate-to-source potential of the switch transistor. Such fluctuations in the gate-to-source potential of the switch transistor can arise when the source junction of the transistor is not connected to AC ground and the gate is driven by a DC signal. Modulations in RON cause the total input impedance of the amplifier stage to be modulated by the common-mode input voltage, introducing distortion along the signal path. For example, consider a sine wave common-mode disturber having a frequency of 11.2 MHz and a 30 MHz DMT (Discrete Multi-Tone) differential input signal of interest, representative of a VDSL2-system. As a measure of linearity, the average MTPR (Missing-Tone Power Ratio) at the output of the first receiver stage can be evaluated. MTPR is defined as the ratio of in-band carrier and in-band spurious-tones, eventually generated by nonlinear effects. MTPR is usually measured in the "gaps" of deliberately missing carriers. For an ideal receiver, the average MTPR is above 100 dB in the absence of a common-mode disturber, which is quite adequate for the target system. The linearity quickly drops to problematic levels when a common-mode disturber is applied at the input. Because such common-mode disturbances can appear at random, they may disrupt an established data link, leading to a reduction in the data rate, or even cause synchronization loss.

The effect common-mode disturbance has on linearity can been addressed by providing a common-mode control-loop which acts on the input nodes of the amplifier. However, a common-mode control-loop adds unwanted noise at the sensitive virtual ground nodes of the differential amplifier. Also, the bandwidth of the common-mode control loop limits the maximum frequency of the common-mode disturber that can be effectively suppressed. Large common-mode bandwidths are in principle attainable with considerable overhead in power consumption, causing the circuit to be very noisy.

Other conventional differential amplification stages employ an active control circuit such as a level shifter for controlling the gates of the MOS transistor switches that form part of the programmable resistor arrays. The level shifter forces the gate nodes of the transistor switches to follow the respective source nodes, i.e. the amplifier virtual ground nodes. Although not problematic with the respect to additional noise, the bandwidth of an active control circuit limits the maximum common-mode frequency for which this technique is effective. For example, in low-noise applications with small input resistors, the total switch size can be quite large. This represents a considerable capacitive load for an amplifier that includes an active control circuit such as a level shifter. This limits the range of common-mode frequencies which can be effectively suppressed for a given transistor switch-size and power budget.

For example, again consider a sine wave common-mode disturber having a frequency of 11.2 MHz and a 30 MHz DMT differential input signal of interest. The 30 MHz DMT signal is applied and the average MTPR for an in-band CM-disturber or worst-case MBPR (Missing-Band-Power-Ratio) for an out-of-band CM-disturber can be evaluated at the output of the receiver stage as a measure of linearity. MBPR is defined as the ratio between a representative in-band carrier and out-of-band spurious tones, eventually generated by non-linear effects (mixing). An active control circuit such as a level shifter effectively compensates for common mode disturbers up to 10 MHz. For common-mode disturber frequencies above 10 MHz, the level shifter performs even worse than if no active gate control is provided, i.e., where the gate nodes of the MOS transistor switches are tied directly to the positive supply VDD. Increasing the bandwidth of the active control circuit is possible, but at the expense of additional power consumption. Common mode disturbers can of course also be filtered externally to the receiver, but this increases the Bill of Material (BOM) and therefore the system cost.

SUMMARY

According to an embodiment of a differential gain stage, the differential gain stage includes a plurality of programmable passive circuit component arrays operable to set a gain of the gain stage. The gain stage also includes an active switch gate control circuit and a passive switch gate control circuit. The active switch gate control circuit controls a gate voltage applied to transistor switch components of each programmable passive circuit component array as a function of the level of common mode disturbance input to the differential gain stage for common mode frequencies below a particular frequency threshold. The passive switch gate control circuit controls the gate voltage applied to the transistor switch components as a function of the level of common mode disturbance for common mode frequencies above the frequency threshold.

According to an embodiment of a receiver, the receiver includes an input stage and a filter. The input stage receives a signal transmitted over a communication link, and includes a differential gain stage. The differential gain stage includes a plurality of programmable passive circuit component arrays for setting a gain of the differential gain stage. The differential gain stage further includes and active switch gate control circuit and a passive switch gate control circuit. The active switch gate control circuit controls a gate voltage applied to transistor switch components of each programmable passive circuit component array as a function of the level of common mode disturbance input to the differential gain stage for common mode frequencies below a particular frequency threshold. The passive switch gate control circuit controls the gate voltage applied to the transistor switch components as a function of the level of common mode disturbance for common mode frequencies above the frequency threshold. The filter is coupled to an output of the input stage.

Those skilled in the art will recognize additional features and advantages upon reading the following detailed description, and upon viewing the accompanying drawings.

DETAILED DESCRIPTION

Figure 1:
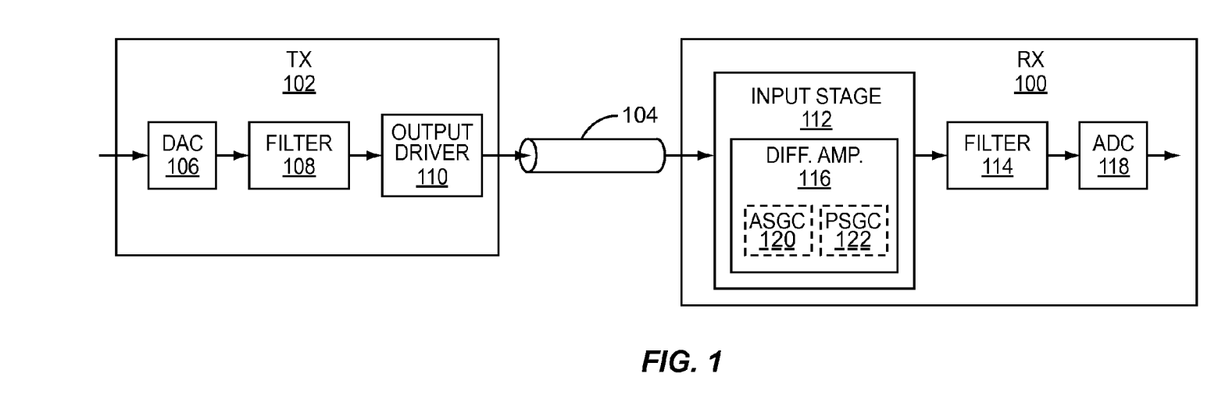
FIG. 1 illustrates a block diagram of an embodiment of a receiver having active switch gate control and passive switch gate control circuitry.

FIG. 1 illustrates a block diagram of an embodiment of a receiver 100 coupled to a transmitter 102 over a communication link 104 such as an electrical or fiber optic cable. The transmitter 102 includes a DAC 106 (digital-to-analog converter), a filter 108 and an output driver 110 for transmitting signals onto the communication link 104. The receiver 100 includes an input stage 112 for receiving the transmitted signals. The input stage 112 may include an LNA (low noise amplifier), PGA (programmable gain amplifier) or the like for amplifying relatively weak signals transmitted over the communication link 104. A filter 114 coupled to the output of the input stage 112 filters the received signal. The input stage 110 includes a differential gain stage 116 coupled to the filter input. The differential gain stage 116 includes a plurality of programmable passive circuit component arrays for setting the gain of the differential gain stage 116. The differential gain stage 116 scales the small differential signal presented at its input to a full-scale value for conversion by an ADC 118 (Analog-to-Digital Converter) after filtering.

During normal operation, common mode signals may pass from the input of the input stage 112 to the differential gain stage 116. The differential gain stage 116 includes an active switch gate control (ASGC) circuit 120 and a passive switch gate control (PSGC) circuit 122 for mitigating the common mode disturbance over a wide frequency band. The ASGC circuit 120 is active for common mode frequencies below a particular frequency threshold and the PSGC circuit 122 is active for common mode frequencies above the frequency threshold. This way, common mode disturbers having a wide range of frequencies, e.g., from around or below several MHz to 100 MHz or greater are effectively suppressed so that the common mode disturbers are not mixed with the desired differential receive signal at the input of the differential gain stage 116, thereby extending receiver performance over a wide operating range. In one embodiment, the receiver 100 is an xDSL receiver. The receiver 100 may be another type of receiver such as a power line communication receiver.

Figure 2:
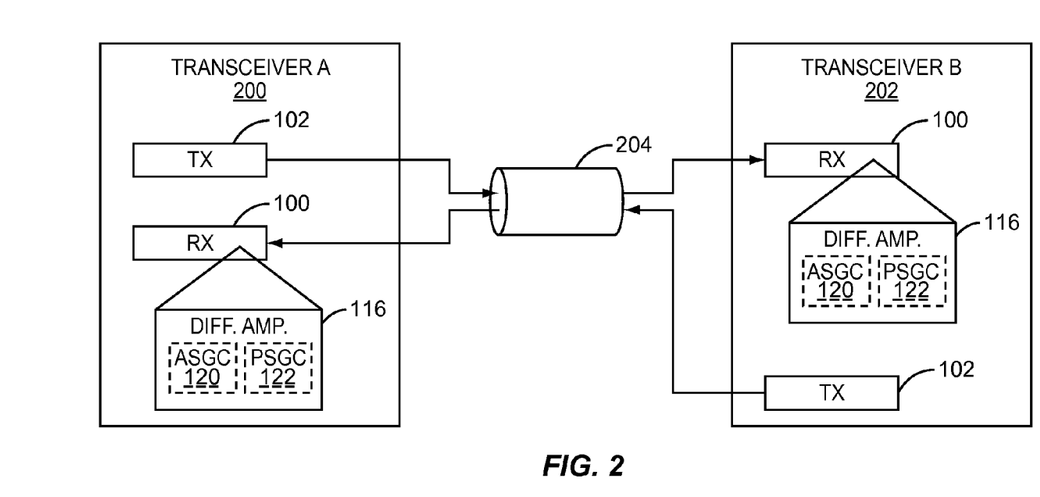
FIG. 2 illustrates a block diagram of an embodiment of a transceiver including a receiver having active switch gate control and passive switch gate control circuitry.

FIG. 2 illustrates a block diagram of an embodiment of two transceivers 200, 202 communicating over a communication link 204, each transceiver 200, 202 including the transmitter and receiver circuitry of FIG. 1. As such, the receiver section 100 of each transceiver 200, 202 includes both the ASGC circuit 120 and the PSGC circuit 122 for mitigating common mode disturbers at the differential gain stage 116 of the receiver 100. In one embodiment, the transceivers 200, 202 are xDSL transceivers. The transceivers 200, 202 may be another type of transceiver such as a power line communication transceiver.

Figure 3:
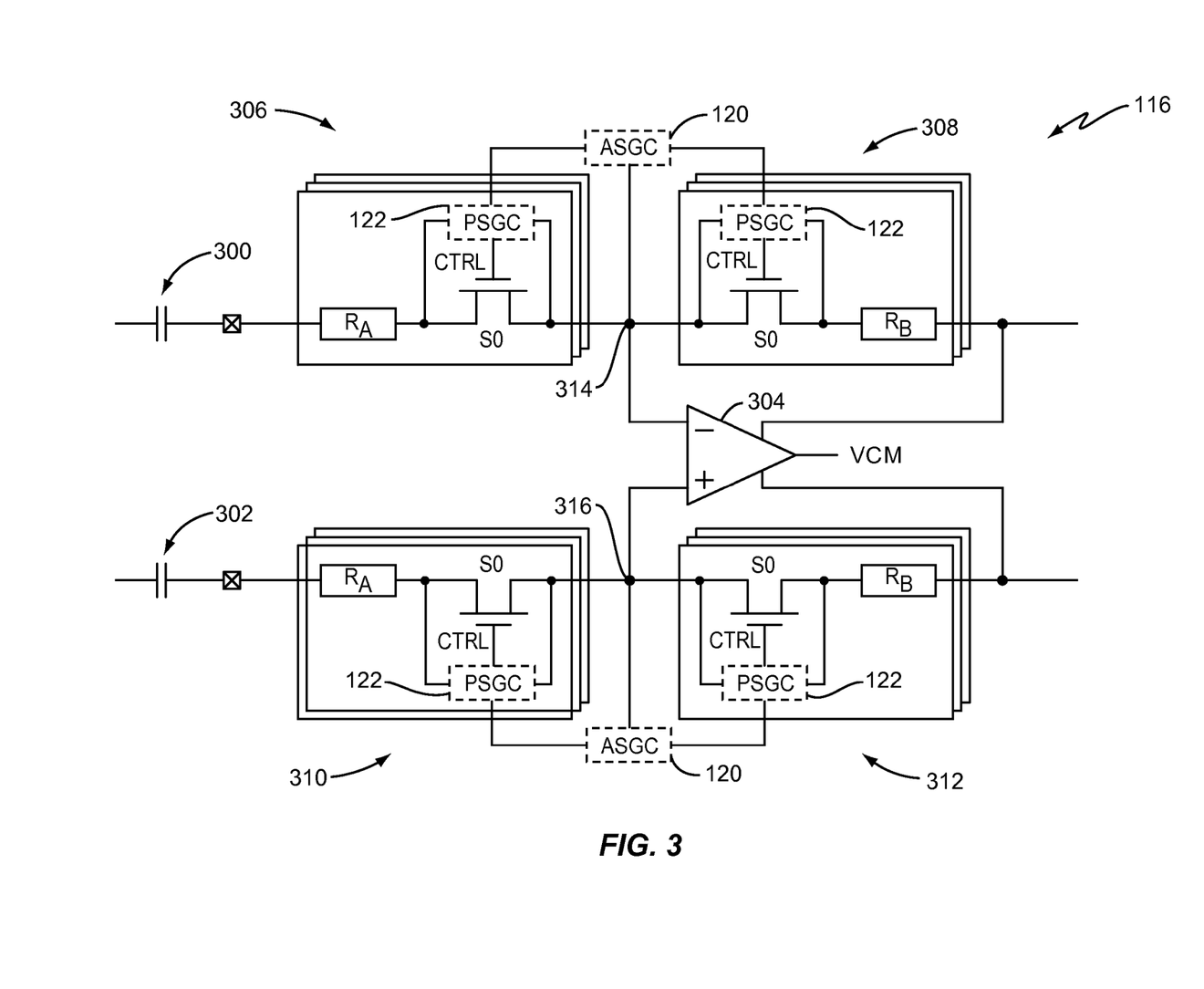
FIG. 3 illustrates a block diagram of an embodiment of a differential gain stage having active switch gate control and passive switch gate control circuitry.

FIG. 3 illustrates a circuit diagram of an embodiment of the differential gain stage 116. The input of the differential gain stage 116 may be capacitively coupled via capacitors 300, 302 and includes a differential op-amplifier (op-amp) 304. The op-amp 304 has differential inputs and differential outputs and scales a small differential receive signal present at the differential input to a full-scale differential signal at the differential output for filtering and analog-to-digital conversion or other processing. The differential gain stage 116 also has programmable passive circuit component arrays 306-312 coupled to the differential input and output of the gain stage 116. In one embodiment, the programmable arrays 306-312 include resistor circuit components. In another embodiment, the programmable arrays 306-312 include capacitor circuit components, e.g., in a combined gain/filter application. Broadly, any type and combination of passive circuit components can be included in the programmable arrays 306-312. For ease of explanation only, operation of the differential gain stage 116 is described next with reference to the programmable arrays 306-312 being programmable resistor arrays.

The gain setting of the differential gain stage 116 is given by equation (1), where R1 in equation (1) corresponds to the total resistance of the programmable resistor arrays 306, 310 coupled between the receive signal input and the virtual ground nodes 314, 316 of the op-amp 304 and R2 corresponds to the total resistance of the programmable resistor arrays 308, 312 coupled between the virtual ground nodes 314, 316 and the differential output of the op-amp 304. Each of the programmable resistor arrays 306-312 includes a plurality of resistors $R_A/R_B$, each in series with a respective transistor switch S0 such as a MOS transistor, e.g., a p-MOS or n-MOS transistor. Each of the individual transistor switches S0 included in the programmable resistor arrays 306-312 can be activated (i.e., switched on) or deactivated (i.e., switched off) via a control signal (CTRL), causing the corresponding series-connected resistor $R_A/R_B$ to be switched into or out of the resistive network. This way, the gain of the differential gain stage 116 can be adjusted as desired.

The linearity of the differential gain stage 116 is adversely affected by common mode disturbance present at the virtual ground nodes 314, 316 of the op-amp 304, the term 'virtual' meaning the nodes 314, 316 are not directly coupled to AC ground. The common-mode control of the differential amplifier stage 116 senses the average of the single-ended output voltages and forces them to the applied common-mode voltage (VCM), while the voltage at the virtual ground nodes is not controlled directly, but rather set by the electrical network itself. Absent some form of mitigation, the common mode disturbance mixes with the differential receive signal at the virtual ground nodes 314, 316, reducing receiver performance. To suppress common mode disturbance over a wide frequency band, the differential gain stage 116 includes both the ASGC and PSGC circuits 120, 122. Each ASGC circuit 120 is coupled between one of the virtual ground nodes 314/316 and the PSGC circuits 122 associated with one of the complimentary differential sides (+ or −) of the gain stage 116. Each PSGC circuit 122 is coupled between the ASGC circuit 120 and the gates of the individual transistor switches S0 of the corresponding programmable resistor array 306-312. The ASGC circuit 120 is referred to herein as being 'active' because it includes one or more transistor devices and is thus effective at mitigating relatively low frequency common mode disturbers, e.g., below 10 MHz, particularly for low-power applications. The PSGC circuit 122 on the other hand is passive and thus is effective at mitigating relatively high frequency common mode disturbers, e.g., above 10 MHz. Together, the ASGC and PSGC circuits 120, 122 extend the gain stage operating range over a very wide common mode frequency band.

Figure 4:
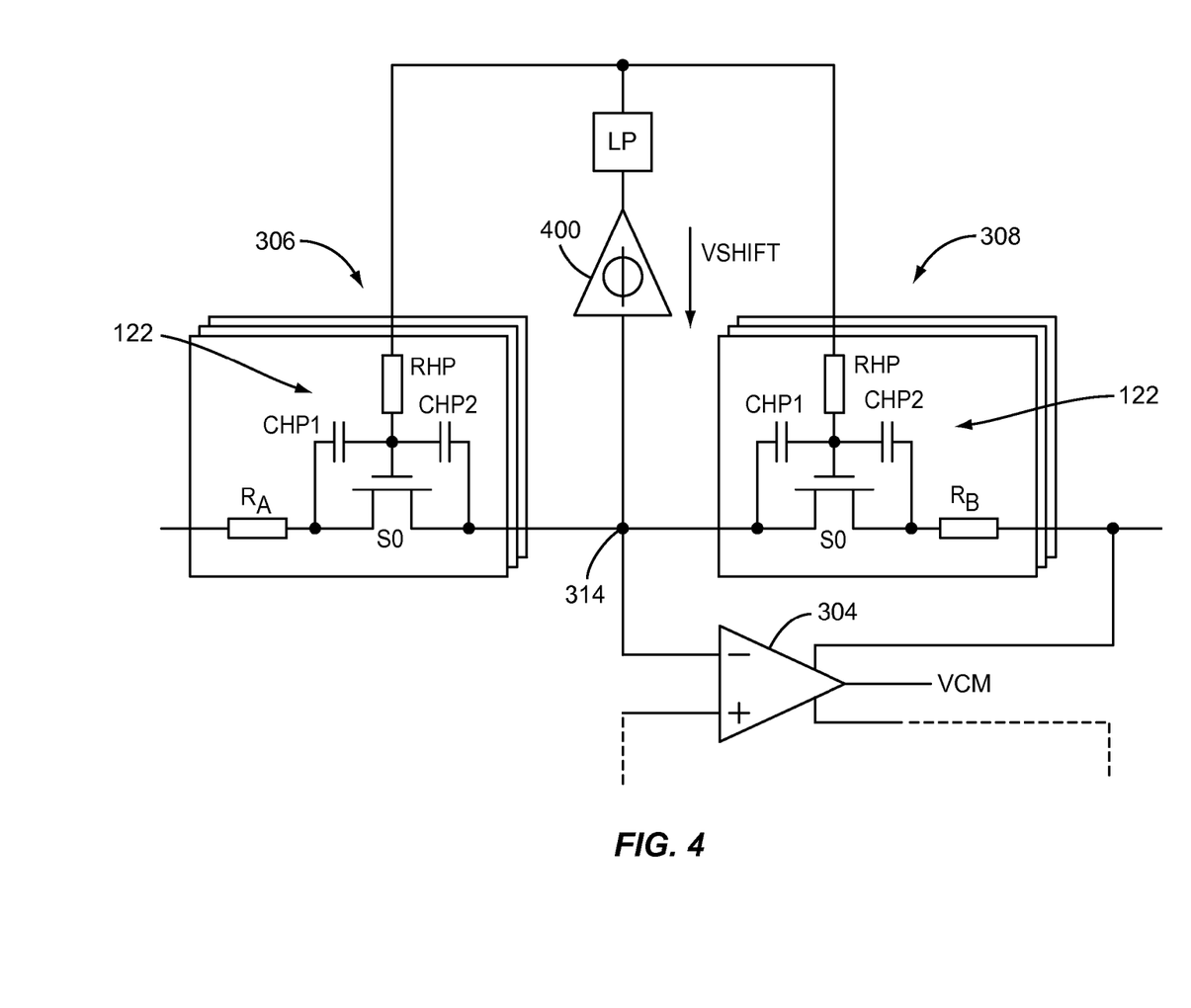
FIG. 4 illustrates a circuit diagram of an embodiment of the active switch gate control and passive switch gate control circuitry.

FIG. 4 illustrates a circuit diagram of an embodiment of the ASGC and PSGC circuits 120, 122 coupled to one of the complimentary differential halves (−) of the gain stage 116. Those skilled in the art will readily recognize that the ASGC and PSGC circuitry described next can be mirrored on the other complimentary half (+) of the gain stage 116. In more detail, the ASGC circuit 120 includes an active level shifter 140 which forces the gate voltage applied to the transistor switches S0 of the programmable resistor arrays 306, 308 to track the common AC voltage present at a virtual ground node 314 of the op-amp 304 plus a DC voltage. The level shifter 400 employs active components such as transistors, and thus has a bandwidth limitation indicated by the box labeled "LP" in FIG. 4. Accordingly, the level shifter 400 is most effective at mitigating common mode disturbance for frequencies below the bandwidth limitation of the level shifter 400. In one embodiment, the frequency threshold is approximately 10 MHz. Beyond this threshold, the PSGC circuit 122 provides the majority of common mode suppression. Other frequency threshold values may be selected depending on the particular application and circuit technology.

Unlike the ASGC circuit 120, the PSGC circuit 122 is passive and thus is more effective at suppressing higher frequency common mode disturbers. According to this embodiment, each instance of the PSGC circuit 122 includes a capacitor CHP1 coupled between the drain and the gate of each transistor switch S0 included in a corresponding one of the programmable resistor arrays 306, 308. The PSGC circuit 122 further includes a second capacitor CHP2 coupled between the source and the gate of the transistor S0. In other embodiments, only one capacitor is employed between the gate and either the drain or source of the transistor S0. The PSGC capacitor(s) CHP1/CHP2 can be partly formed from the intrinsic capacitance of the corresponding transistor switch S0, plus some additional capacitance. In some embodiments, the capacitor(s) CHP1/CHP2 of the PSGC circuit 122 have a capacitance of about 10× that of the intrinsic capacitance of the corresponding transistor switch S0. The PSGC circuit 122 also includes an isolation resistor RHP coupled between the gate of the transistor switch S0 and the active level shifter 400. In one embodiment, the isolation resistor RHP is approximately 250 kΩ for certain xDSL applications. Other resistor values may be used depending upon the type of application and circuit technology.

The isolation resistor RHP in conjunction with the capacitors CHP1/CHP2 of the PSGC circuit 122 form a low pass filter looking into the PSGC circuit 122 from the active level shifter 400. Accordingly, the output of the level shifter 400 is isolated from the gates of the transistor switches S0 included in the programmable resistor arrays 306, 308 for relatively high-frequency common-mode signals, e.g., above 10 MHz or some other desirable frequency threshold. When the PSGC circuit 122 employs both capacitors CHP1 and CHP2, the AC-signals present at the drain and source of each transistor switch S0 are passed to the gate via the capacitors, producing a weighted sum of the drain and source AC-voltages at the transistor gate. In other embodiments, only the AC signal present at either the drain or the source of the transistor switch S0 is passed to the gate when the PSGC circuit 122 employs either CHP1 or CHP2, but not both. In either case, CHP1 and/or CHP2 control the gate voltage of the transistor S0 as a function of the level of common mode disturbance to prevent the gate voltage from following the common mode signal, thereby suppressing high frequency common mode disturbance. That is, the PSGC 122 ensures the gate-to-source voltage of the transistor S0 remains relatively constant despite high frequency common mode disturbance by reproducing the common mode voltage fluctuations at the gate in a way that essentially cancels the original common mode signal.

The DC voltage which sets the average gate overdrive for the transistor switches S0 together with the low-frequency content generated by the active level shifter 400 are superimposed with the high-frequency content provided by the capacitors CHP1/CHP2 of the PSGC circuit 122 at the gate of each transistor switch S0. As such, the gate voltage of each transistor switch S0 included in the programmable resistor arrays 306, 308 is controlled with the combination of active level-shifting for low-frequency input signals (including DC, which sets the average gate overdrive), and by a passive feed-forward mechanism for high-frequency input signals through at least one capacitor CHP1/CHP2 of the PSGC circuit 122. In an ideal case, a spectrally flat transfer function from the input node to the gate of the transistor switches S0 can be achieved, yielding very effective common-mode suppression up to relatively high-frequencies, without increasing the power consumption of the active level shifter 400.

Figure 5:
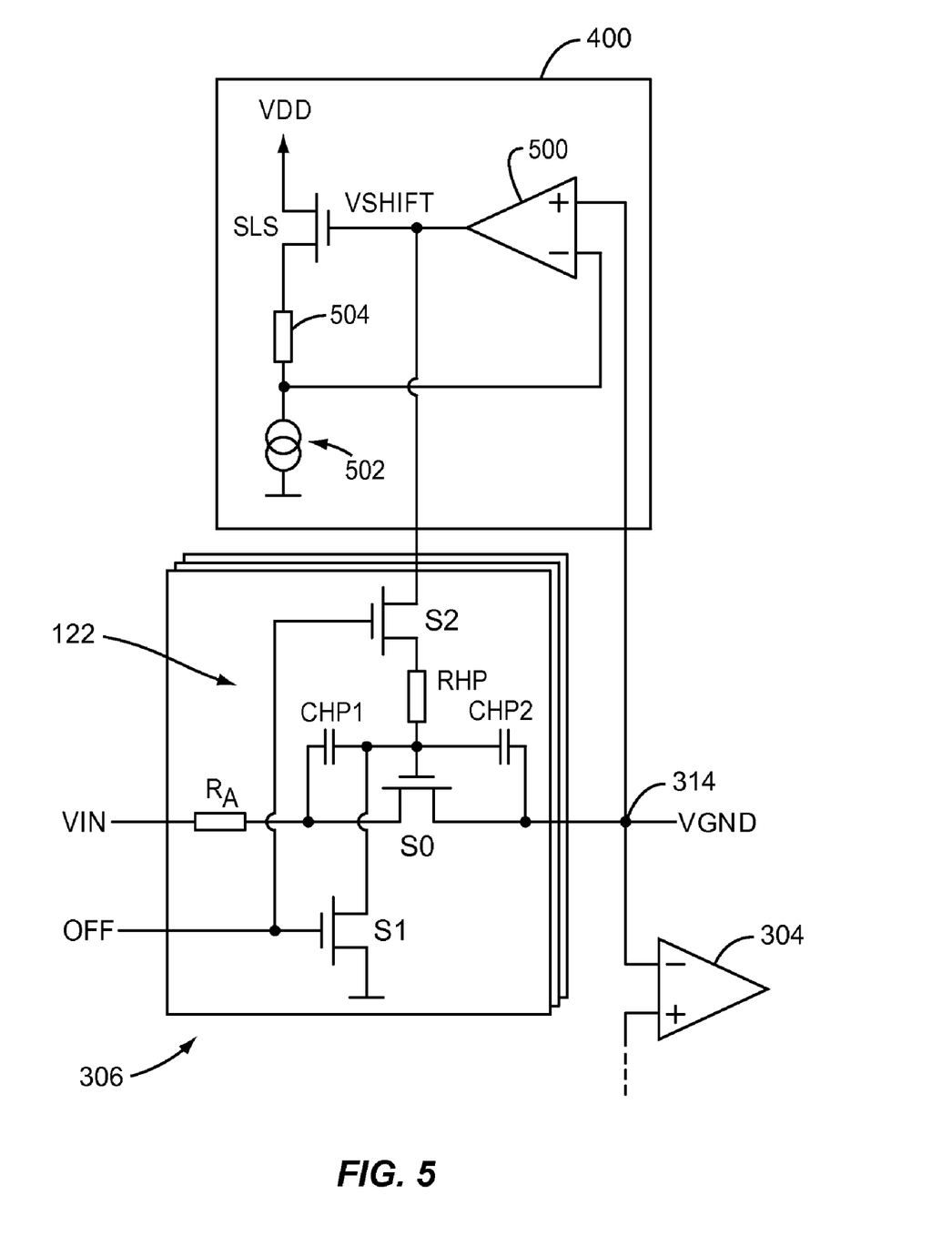
FIG. 5 illustrates a circuit diagram of another embodiment of the active switch gate control and passive switch gate control circuitry.

FIG. 5 illustrates a circuit diagram of an embodiment of a single transistor switch-bank coupled to the differential gain stage 116. According to this embodiment, each instance of the PSGC circuit 122 includes the isolation resistor RHP and at least one of the feed-forward capacitors CHP1 and CHP2. In addition, auxiliary MOS transistor switches S1 and S2 are provided for switching off transistor S0 so that the resistor $R_A$ coupled in series with NMOS transistor S0 can be switched out of the resistive network. When the control signal OFF supplied to auxiliary transistors S1 and S2 is a logic low value, NMOS transistor S1 is turned off and PMOS transistor S2 acts as a pass-transistor, passing the DC-voltage VSHIFT from the active level shifter 400 to the gate of transistor S0 for turn-on. Transistor S2 can be made small, since its on-resistance adds to the isolation resistance of the PSGC circuit 122. FIG. 5 shows the active level shifter 400 in more detail. Particularly, the level shifter 400 includes a differential amplifier 500 and NMOS transistor SLS coupled between a DC power supply VDD and a current source 502, and a resistor 504 for setting the level-shifting voltage VSHIFT. The level shifter 400 adjusts the voltage supplied to the gate of the transistor switches S0 of the corresponding programmable resistor array 306 as a function of the level of common mode disturbance detected by the amplifier 500 so that the gate voltage follows the common mode signal present at the source of S0, thereby suppressing low frequency common mode disturbance. That is, the ASGC 120 ensures the gate-to-source voltage of the transistor S0 remains relatively constant despite low frequency common mode disturbance by reproducing the common mode voltage fluctuations at the gate in a way that essentially cancels the original common mode signal. This way, the channel resistance RON of each transistor switch S0 is not modulated by low frequency common mode disturbers, limiting the amount of mixing that occurs between common mode disturbers and the desired differential receive signal at the input to the differential op-amp 304. The PSGC circuit 122 likewise prevents common-mode induced RON modulation for higher frequency common mode disturbers as previously explained herein.

Figure 6:
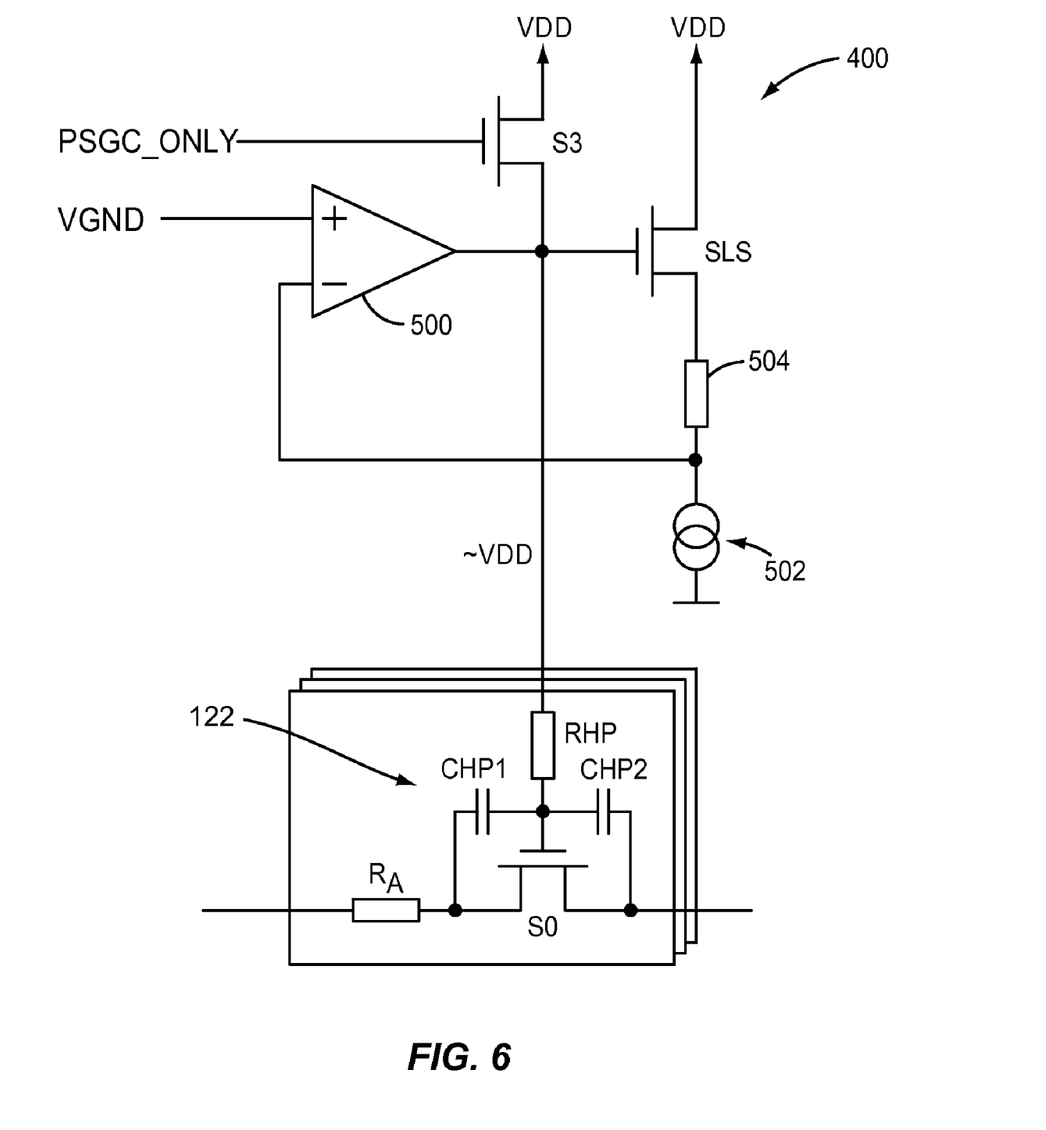
FIG. 6 illustrates a circuit diagram of yet another embodiment of the active switch gate control and passive switch gate control circuitry.

FIG. 6 illustrates a circuit diagram of another embodiment of a single transistor switch-bank for coupling to the differential gain stage 116. According to this embodiment, in case the common-mode disturbers are only at high-frequencies, the active level shifter 400 can be switched off since the ASGC circuit 120 is more ideally suited for suppressing only low frequency common mode disturbers. To this end, an additional transistor S3 connects the output of the then powered down active level shifter 400 to the supply voltage VDD responsive to signal PSGC_ONLY so that the transistors switches S0 of the programmable resistor arrays 306-312 are provided gate overdrive via resistor RHP. As such, only the passive feed-forward path of the PSGC circuit 122 controls the gate voltage of the transistor switches S0 as a function of the level of common mode disturbance for high signal frequencies.

Figure 7:
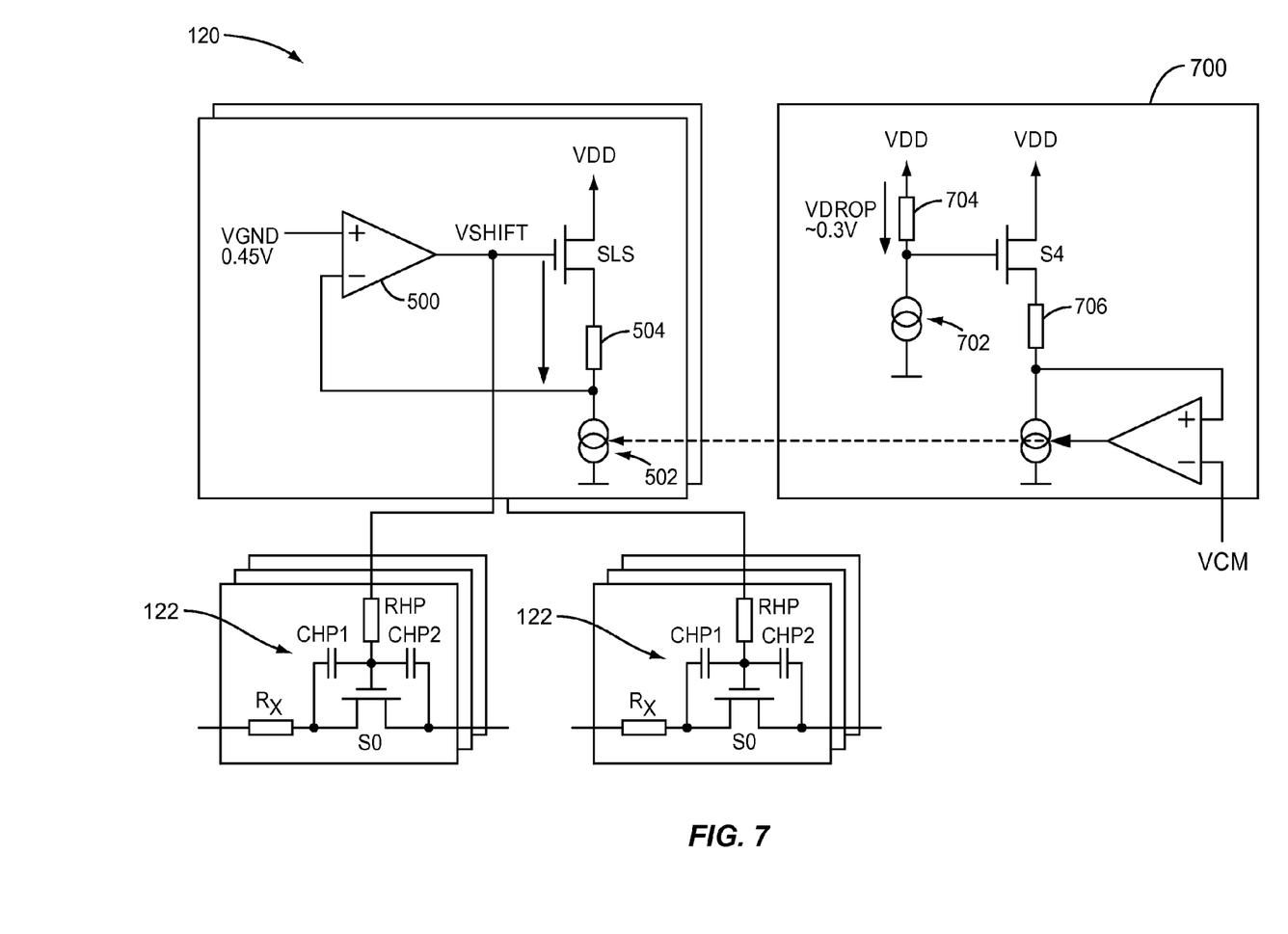
FIG. 7 illustrates a circuit diagram of still another embodiment of the active switch gate control and passive switch gate control circuitry.

FIG. 7 illustrates a circuit diagram of an embodiment of a circuit 700 for providing a reliable generation of the turn-on DC-voltage. The circuit 700 is a replica of the ASGC circuit 120. The gate of the activated transistor S4 included in the replica circuit 700 is set to a voltage of VDROP below the supply voltage VDD, as generated by a current source 702 and corresponding resistor 704. The current source 702 can be designed to generate current based on a bandgap reference voltage with a matching resistor 706. The current output by the replica circuit 700 provides a reliable current source to the ASGC circuit 120.

Figure 8:
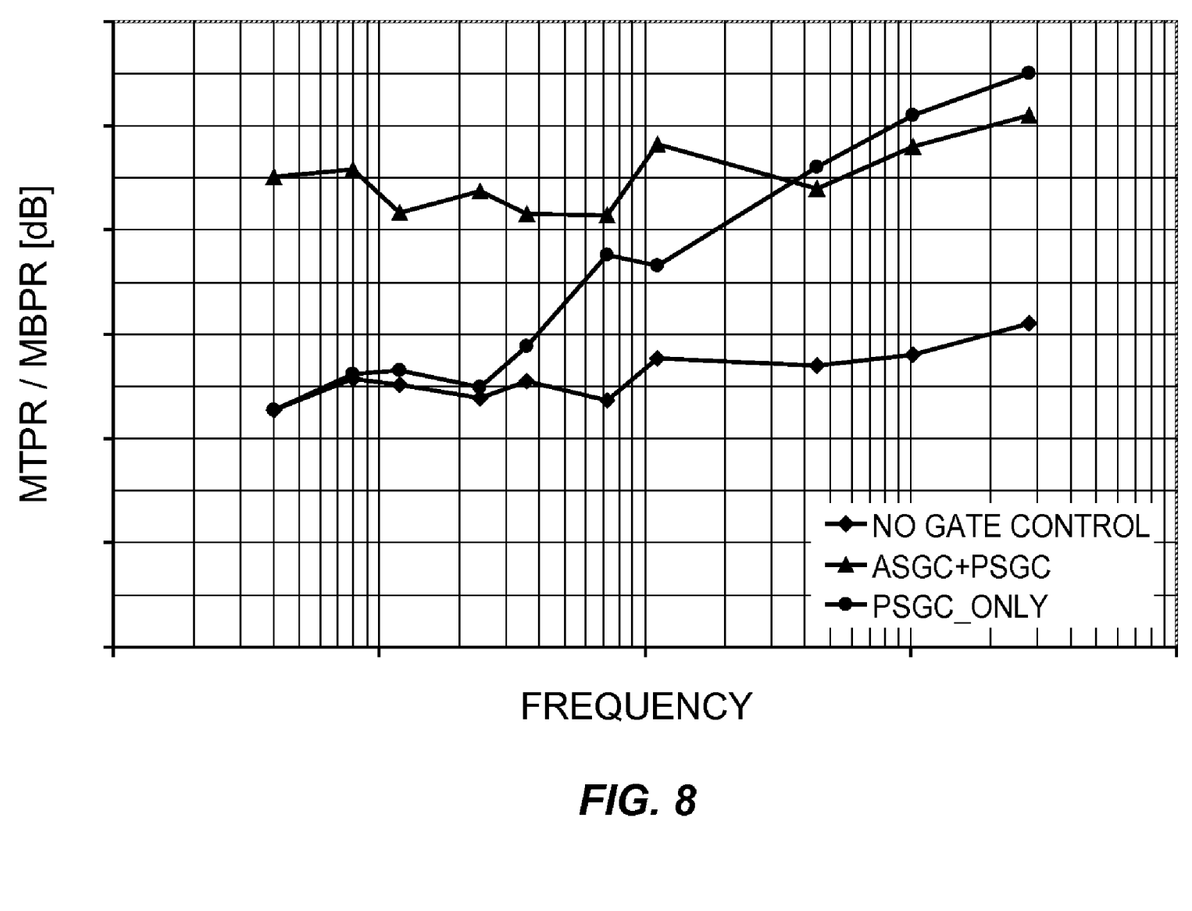
FIG. 8 illustrates a plot diagram of differential gain stage performance without transistor gate voltage control, with passive transistor gate voltage control and with active and passive transistor gate voltage control.

FIG. 8 illustrates a plot illustrating simulation results of the effects of common mode disturbance on the differential gain stage 116 without transistor gate voltage control, with transistor gate voltage control using both the ASGC and PSGC circuits 120, 122 and with transistor gate voltage control using the PSGC circuit 122, but with the ASGC circuit 120 disabled as shown in FIG. 6. The plot shows MTPR and MBPR as a function of common mode disturber frequency. The signal of interest is a 30 MHz differential DMT signal and the common mode disturber is a 200 mVpp sine-wave signal with different frequencies. When the frequency of the common-mode disturber happens to be above 10 MHz, the active level shifter circuit 400 could even be deactivated as described previously herein, improving gain stage performance as shown in FIG. 8, but sparing the power otherwise dissipated in the ASGC 120. Regardless of whether the ASGC circuit 120 is activated or not, system performance significantly improves when transistor gate voltage control is implemented as described herein, particularly for higher frequency common mode disturbers.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of operating a differential gain stage having a plurality of programmable passive circuit component arrays for setting a gain of the differential gain stage, the method comprising:

using an active switch gate control circuit to control a gate voltage applied to transistor switch components of each programmable passive circuit component array as a function of the level of common mode disturbance input to the differential gain stage for common mode frequencies below a particular frequency threshold; and using a passive switch gate control circuit to control the gate voltage applied to the transistor switch components as a function of the level of common mode disturbance for common mode frequencies above the frequency threshold.

2. The method of claim 1, comprising:

forcing the gate voltage applied to the transistor switch components to track a common AC voltage present at virtual ground nodes of the differential gain stage plus a DC voltage for common mode frequencies below the frequency threshold; and forcing the gate voltage applied to the transistor switch components to track a common AC voltage at the source and/or drain of the transistor switch components for common mode frequencies above the frequency threshold.

3. The method of claim 2, comprising capacitively coupling at least one of the source and drain of each transistor switch component to the gate of the transistor switch component for common mode frequencies above the frequency threshold.

4. The method of claim 2, comprising applying a weighted sum of the common AC voltages at the source and drain of each transistor switch component to the gate of the transistor switch component for common mode frequencies above the frequency threshold.

5. The method of claim 1, comprising isolating the active switch gate control circuit from the gates of the transistor switch components for common mode frequencies above the frequency threshold.

6. The method of claim 1, further comprising switching off one or more of the transistor switch components by decoupling the gate of the one or more transistor switch components from the active switch gate control circuit and coupling the gate of the one or more transistor switch components to a potential sufficient for switching off the one or more transistor switch components.

7. A differential gain stage, comprising:

a plurality of programmable passive circuit component arrays operable to set a gain of the differential gain stage;

an active switch gate control circuit operable to control a gate voltage applied to transistor switch components of each programmable passive circuit component array as a function of the level of common mode disturbance input to the differential gain stage for common mode frequencies below a particular frequency threshold; and a passive switch gate control circuit operable to control the gate voltage applied to the transistor switch components as a function of the level of common mode disturbance for common mode frequencies above the frequency threshold.

8. The differential gain stage of claim 7, wherein the active switch gate control circuit comprises a level shifter operable to force the gate voltage applied to the transistor switch components to track a common AC voltage present at virtual ground nodes of the differential gain stage plus a DC voltage for common mode frequencies below the frequency threshold, and wherein the passive switch gate control circuit comprises RC circuitry operable to force the gate voltage applied to the transistor switch components to track a common AC voltage at the source and/or drain of the transistor switch components for common mode frequencies above the frequency threshold.

9. The differential gain stage of claim 8, wherein the RC circuitry comprises a capacitor operable to capacitively couple the source or the drain of each transistor switch component to the gate of the transistor switch component for common mode frequencies above the frequency threshold.

10. The differential gain stage of claim 8, wherein the RC circuitry comprises a first capacitor coupled between the source of each transistor switch component and the gate of the transistor switch component and a second capacitor coupled between the drain of each transistor switch component and the gate of the transistor switch component, the first and second capacitors being operable to apply a weighted sum of the common AC voltages at the source and the drain of each transistor switch component to the gate of the transistor switch component for common mode frequencies above the frequency threshold.

11. The differential gain stage of claim 7, wherein the passive switch gate control circuit comprises an isolation resistor and one or more capacitors operable to isolate the active switch gate control circuit from the gates of the transistor switch components for common mode frequencies above the frequency threshold.

12. The differential gain stage of claim 11, wherein the active switch gate control circuit comprises a transistor operable to pass a DC supply voltage to the isolation resistor of the passive switch gate control circuit responsive to the active switch gate control circuit being inactive for common mode frequencies above the frequency threshold.

13. The differential gain stage of claim 7, wherein the passive switch gate control circuit comprises a first transistor operable to decouple the gate of one or more of the transistor switch components from the active switch gate control circuit and a second transistor operable to couple the gate of the one or more transistor switch components to a potential sufficient for switching off the one or more transistor switch components.

14. The differential gain stage of claim 7, wherein each programmable passive circuit component array is a programmable resistor array.

15. A differential gain stage, comprising:

a plurality of programmable passive circuit component arrays operable to set a gain of the differential gain stage;

a first means for controlling a gate voltage applied to transistor switch components of each programmable passive circuit component array as a function of the level of common mode disturbance input to the differential gain stage for common mode frequencies below a particular frequency threshold; and a second means for controlling the gate voltage applied to the transistor switch components as a function of the level of common mode disturbance and isolating the first means for controlling the gate voltage from the gates of the transistor switch components for common mode frequencies above the frequency threshold.

16. A method of operating a receiver, comprising:

inputting a received signal to a differential gain stage of the receiver, the differential gain stage having a plurality of programmable passive circuit component arrays for setting a gain of the differential gain stage;

using an active switch gate control circuit to control a gate voltage applied to transistor switch components of each programmable passive circuit component array as a function of the level of common mode disturbance input to the differential gain stage for common mode frequencies below a particular frequency threshold; and using a passive switch gate control circuit to control the gate voltage applied to the transistor switch components as a function of the level of common mode disturbance for common mode frequencies above the frequency threshold.

17. The method of claim 16, wherein the received signal is a DSL-based signal.

18. The method of claim 16, comprising isolating the active switch gate control circuit from the gates of the transistor switch components for common mode frequencies above the frequency threshold.

19. A receiver, comprising:

an input stage operable to receive a signal transmitted over a communication link, the input stage including a differential gain stage comprising:

a plurality of programmable passive circuit component arrays operable to set a gain of the differential gain stage, an active switch gate control circuit operable to control a gate voltage applied to transistor switch components of each programmable passive circuit component array as a function of the level of common mode disturbance input to the differential gain stage for common mode frequencies below a particular frequency threshold, and a passive switch gate control circuit operable to control the gate voltage applied to the transistor switch components as a function of the level of common mode disturbance for common mode frequencies above the frequency threshold; and a filter coupled to an output of the input stage.

20. A transceiver including the receiver of claim 19.

21. The receiver of claim 19, wherein the receiver is a DSL-compliant receiver.

22. The receiver of claim 19, wherein the active switch gate control circuit comprises a level shifter operable to force the gate voltage applied to the transistor switch components to track a common AC voltage present at virtual ground nodes of the differential gain stage plus a DC voltage for common mode frequencies below the frequency threshold, and wherein the passive switch gate control circuit comprises RC circuitry operable to force the gate voltage applied to the transistor switch components to track a common AC voltage at the source and/or drain of the transistor switch components for common mode frequencies above the frequency threshold.

23. The receiver of claim 19, wherein the passive switch gate control circuit comprises an isolation resistor and one or more capacitors operable to isolate the active switch gate control circuit from the gates of the transistor switch components for common mode frequencies above the frequency threshold.

24. The receiver of claim 23, wherein the active switch gate control circuit comprises a transistor operable to pass a DC supply voltage to the isolation resistor of the passive switch gate control circuit responsive to the active switch gate control circuit being inactive for common mode frequencies above the frequency threshold.

25. The receiver of claim 19, wherein each programmable passive circuit component array is a programmable resistor array.

\* \* \* \* \*